United States Patent
Hu et al.

(10) Patent No.: US 7,808,071 B2
(45) Date of Patent: Oct. 5, 2010

(54) SEMICONDUCTOR DEVICE HAVING IMPROVED OXIDE THICKNESS AT A SHALLOW TRENCH ISOLATION EDGE AND METHOD OF MANUFACTURE THEREOF

(75) Inventors: Binghua Hu, Plano, TX (US);
Mindricelu P. Eugen, Dallas, TX (US);
Damien T. Gilmore, Allen, TX (US);
Bill A. Wofford, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 205 days.

(21) Appl. No.: 12/166,395

(22) Filed: Jul. 2, 2008

(65) Prior Publication Data
US 2010/0001364 A1    Jan. 7, 2010

(51) Int. Cl.
*H01L 21/02* (2006.01)
(52) U.S. Cl. ............................. 257/500; 257/502
(58) Field of Classification Search ............ 257/500, 257/501, 502, 374, 446
See application file for complete search history.

(56) References Cited

U.S. PATENT DOCUMENTS

| | | | |
|---|---|---|---|
| 7,038,291 B2 * | 5/2006 | Goda et al. | 257/510 |
| 7,119,412 B2 * | 10/2006 | Yamamoto | 257/500 |
| 2008/0180974 A1 * | 7/2008 | Shiraishi et al. | 363/24 |
| 2009/0191688 A1 * | 7/2009 | Hu et al. | 438/424 |

* cited by examiner

*Primary Examiner*—Thao P. Le
(74) *Attorney, Agent, or Firm*—Jacqueline J. Garner; Wade J. Brady, III; Frederick J. Telecky, Jr.

(57) ABSTRACT

One aspect of a semiconductor device includes an active region located in a semiconductor substrate and having an isolation region located therebetween. The active regions have corners adjacent the isolation region. An oxide layer is located over the active regions and the corners, which may also include edges of the active regions, and a ratio of a thickness of the oxide layer over the corners to a thickness of the oxide layer over the active regions ranges from about 0.6:1 to about 0.8:1. A gate is located over the active region and the oxide layer.

10 Claims, 6 Drawing Sheets

SEMICONDUCTOR DEVICE HAVING IMPROVED OXIDE THICKNESS AT A SHALLOW TRENCH ISOLATION EDGE AND METHOD OF MANUFACTURE THEREOF

TECHNICAL FIELD

The disclosure is directed to a semiconductor device having improved gate oxide thickness at a shallow trench isolation edge and a method for manufacturing that device.

BACKGROUND

Analog requirements to integrate on the same chip high density logic with high voltage, high power devices has led to the wide acceptance of dual gate (split gate) technologies. In addition, continuous scaledown demands have resulted in increased aspect ratios for shallow isolation trenches (STI) between active devices. Atmospheric-pressure chemical vapor deposition (APCVD) has met the isolation demands for technologies with gate lengths greater than 0.5 um, but for smaller technologies with higher STI aspect ratios, high density plasma deposition process has been used instead.

HDP provides much better fill for shallow isolation trenches when higher STI aspect ratios are present like technologies with gate length less than 0.5 um. However, the semiconductor manufacturing industry has since learned that the HDP is a higher stress material, and as a result, oxide thinning occurs on the corners of the active regions. Moreover, the additional stress placed on the walls of the isolation trenches causes a number of other silicon defects, thereby increasing defect densities of various devices.

SUMMARY

One embodiment provides a semiconductor device that has high voltage (HV) active regions located in a semiconductor substrate. Each of the HV active regions is located between isolation regions and has a corner adjacent the isolation regions. The isolation regions comprise a high density plasma (HDP) oxide. A HV gate oxide layer is located over the HV active region and has a thickness of greater than 5 nm. A ratio of thickness of the HV gate oxide layer over the corners to the thickness of the HV gate oxide over the HV active regions ranges from about 0.6:1 to about 0.8:1. HV gates are located over at least a portion of the HV gate oxide layer. The device in this embodiment further includes low voltage (LV) active regions that are located in the semiconductor substrate. A LV gate oxide layer is located over the LV active regions and has a thickness less than about 5 nm, and a LV gate is located over at least a portion of the LV gate oxide layer.

Another embodiment provides a semiconductor device that includes an active region located in a semiconductor substrate and between isolation regions and has a corner at each of the isolation regions. An oxide layer is located over the active region and the corner, and a ratio of a thickness of the oxide layer over the corners to a thickness of the gate oxide over the active region ranges from about 0.6:1 to about 0.8:1. A gate is located over at least a portion of the active region and the oxide layer.

Another embodiment provides a method of manufacturing a semiconductor device. This embodiment includes forming HV active regions in a semiconductor substrate. Each of the HV active regions is located between isolation regions and has a corner adjacent the isolation regions and the isolation regions comprise a high density plasma oxide. A dry oxidation process is used to form a HV gate oxide layer over the HV active regions and the corners, wherein the HV gate oxide layer has a thickness greater than about 5 nm. The dry oxidation process employs a gas flow including oxygen and trans 1,2 dicholorethene (TLC), wherein the TLC comprises 2% to 6% of the gas flow. HV gates are formed over at least a portion of the HV gate oxide layer. This embodiment further includes forming LV active regions in the semiconductor substrate, forming a LV gate oxide layer located over the LV active regions to a thickness of less than about 5 nm, and forming a LV gate over the LV active regions and at least a portion of the LV gate oxide layer.

Another embodiment provides a method of manufacturing a semiconductor device that includes forming an active region in a semiconductor substrate. The active region is located between isolation regions and has a corner adjacent the isolation regions. A dry oxidation process is used to form an oxide layer over the active region and the corners. The dry oxidation process employs a gas flow including oxygen and a low molecular weight chloro-carbon wherein the chloro-carbon comprises about 6% or less of the gas flow. This embodiment further includes forming a gate over the active region and at least a portion of the oxide layer.

BRIEF DESCRIPTION OF DRAWINGS

The disclosure is described with reference to example embodiments and to accompanying drawings, wherein:

FIGS. 2-6B illustrate different stages of the fabrication of a semiconductor device using the principles of this disclosure;

DETAILED DESCRIPTION

The embodiments as discussed herein provide a semiconductor device and method of manufacture thereof having a HV active region that has an improved oxide thickness on its corner adjacent an isolation region. The oxide thickness ratio of the oxide thickness located over the active region to the oxide thickness located over the corners is such that the breakdown voltage of the gate oxide is increased, which provides the ability to endure more power cycles. Additionally, physical stresses at the interface between the STI structure and active region are decreased through improved gate oxide integrity. Additionally, the device has lower interface trap and defect densities than devices fabricated using conventional processes, which results in increased device yields.

These benefits are achieved by using a dry oxidation process that employs a low molecular weight chloro-carbon compound. The use of such compounds is counter intuitive with respect to current processes in that semiconductor manufactures avoid the use of chlorine in view of its corrosive effects within the delivery system. However, this disclosure recognizes the benefits associated with using a low molecular weight chloro-carbon compound, which avoids corrosive effects, yet allows for a more controlled oxidation process that promotes more oxide growth on the corners, which may also include the edges, of the active region and reduces corner thinning that occurs with conventional dry oxidation processes. It has been found that the processes covered by the embodiments described herein not only provide a device with increased device reliability and reduced defects densities, but it also getters metals, does not significantly shift the electrical parameters of the device, and integrates well into many standard semiconductor manufacturing process flows.

Figure 1:
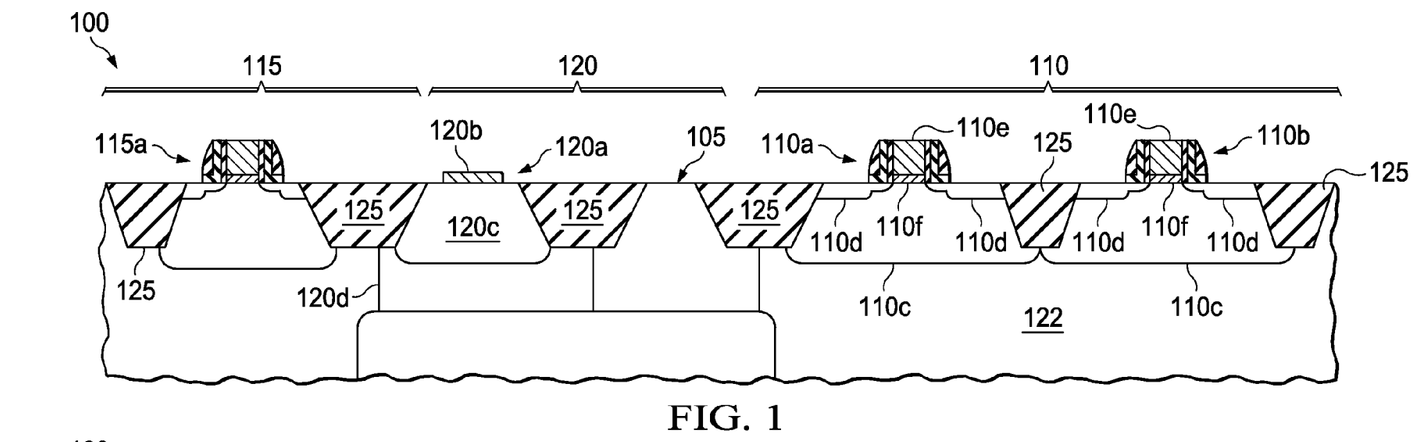
FIG. 1 illustrates a semiconductor device that can be made using the principles of this disclosure.

FIG. 1 illustrates one embodiment of a semiconductor device 100 that can be made in accordance with this disclosure. In this embodiment, the device 100 includes an integrated circuit (IC) 105. Though the configuration of the IC 105 will depend on design and function, in the illustrated embodiment, the IC 105 includes a HV region 110, a LV region 115, and a BP region 120, all of which are located within a semiconductor substrate 122, such as a doped silicon, silicon-germanium, etc. As used herein, high voltage refers to a voltage of 5 volts or greater, while low voltage refers to a voltage of less than 5 volts.

The HV region 110 may be configured as a complementary device that includes both a PMOS transistor 110a and an NMOS transistor 110b. The PMOS and NMOS transistors 110a, 110b each include an active region 110c, which in some conventions may be referred to as a moat, in which source/drains 110d are located, as shown. These transistors also include gates 110e having a gate length, shown in cross-section, of less than one micron and that are isolated from the respective active region 110c by a gate oxide 110f. It should be noted that an active region is a region in which a depletion region of majority carriers or minority carriers is formed during an applied voltage to the transistor. In the PMOS and NMOS transistors 110a, 110b, the action region 110c may be an appropriately doped conventional well in which the conventional source/drains 110d are located. The LV region 115 may also have a complementary configuration similar to the HV region 110. However, for brevity, only a LV PMOS transistor 115a is shown and specific designations have been omitted.

It should be noted that the transistors 110a, 110b in the HV region 110 will have a thicker gate oxide 110f than the transistors 115a in the LV region 115. The HV region transistors 110a, 110b require a thicker gate because of the high voltages used to operate the transistors. For example, the gate oxide thickness in the HV region 110 will be about 5.0 nm or greater, while the gate oxide thickness in the LV region will be less than 5.0 nm. Moreover, the PMOS transistor 115a will be doped and configured for low voltage applications. The BP region 120 may include a conventional bipolar transistor 120a having an emitter 120b, base 120c and collector 120d. Unless otherwise specified herein, the active region 110c, the source/drains 110d and the gates 110e, the LV transistor 115a and the bipolar transistor 120a may be fabricated using conventional processes and materials. Isolation regions 125, which in one embodiment may be conventional shallow trench isolation regions, electrically isolate the respective devices.

Figure 2:
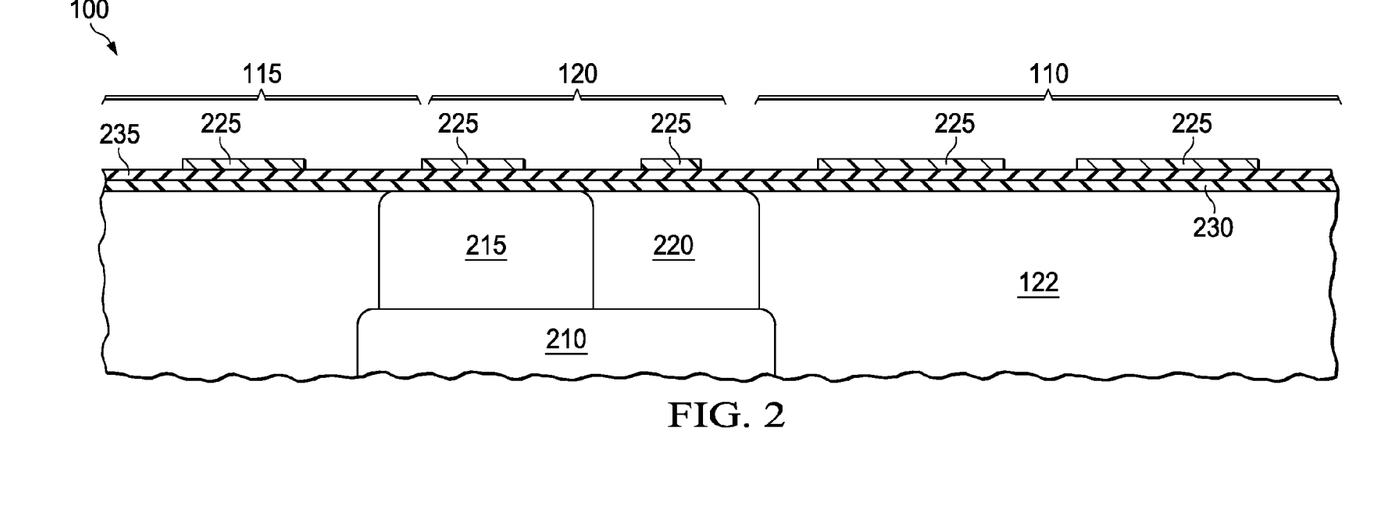

FIG. 2 illustrates an embodiment of the semiconductor device 100 of FIG. 1 at an earlier stage of manufacture and after the formation of deep isolation region 210, BP collector and contact regions 215, 220. A lithographic mask 225 has been patterned on a pad oxide layer 230 and nitride layer 235 to expose the appropriate regions of the pad oxide 230 in the HV region 110, the LV region 115, and the BP region 120 to an etch process. Conventional processes and materials may be used to achieve the embodiment shown in FIG. 2.

Figure 3:
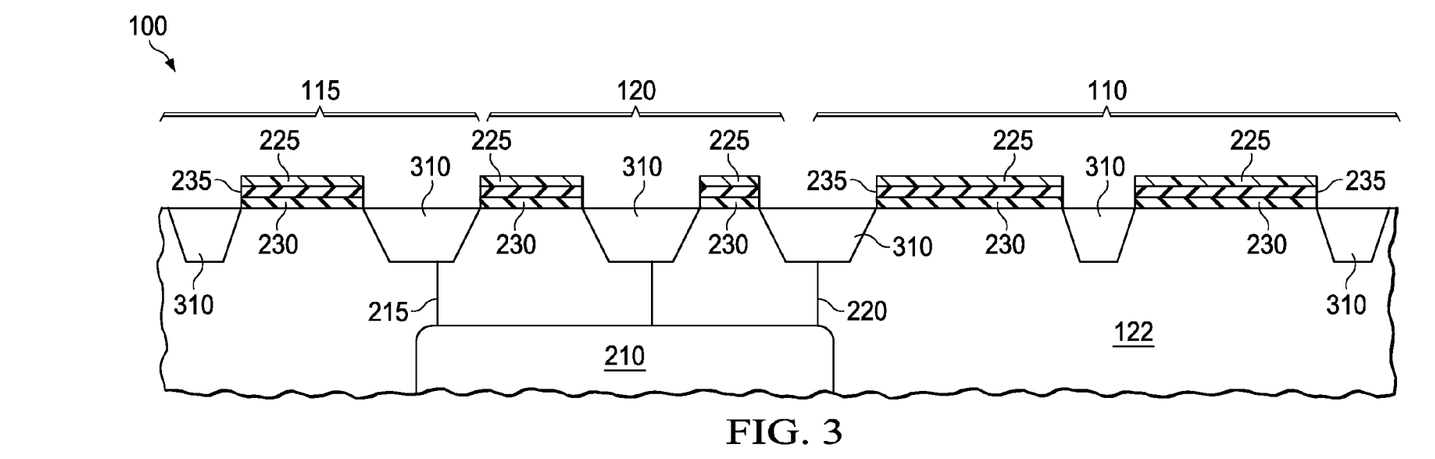

FIG. 3 illustrates the device 100 of FIG. 2 after the formation of isolation trenches 310. Conventional etching processes may be used to form the isolation trenches 310. After formation of the trenches 310, conventional processes may be used to form an oxide liner in each trench, which is not shown. In certain embodiments, the isolation trenches 310 may have a high aspect ratio, (e.g., a ratio of 2:1, which can make them difficult to fill with oxide. Thus, in such instances, an oxidation deposition process that achieves a good fill in these high aspect ratio trenches is desirable.

Figure 4:
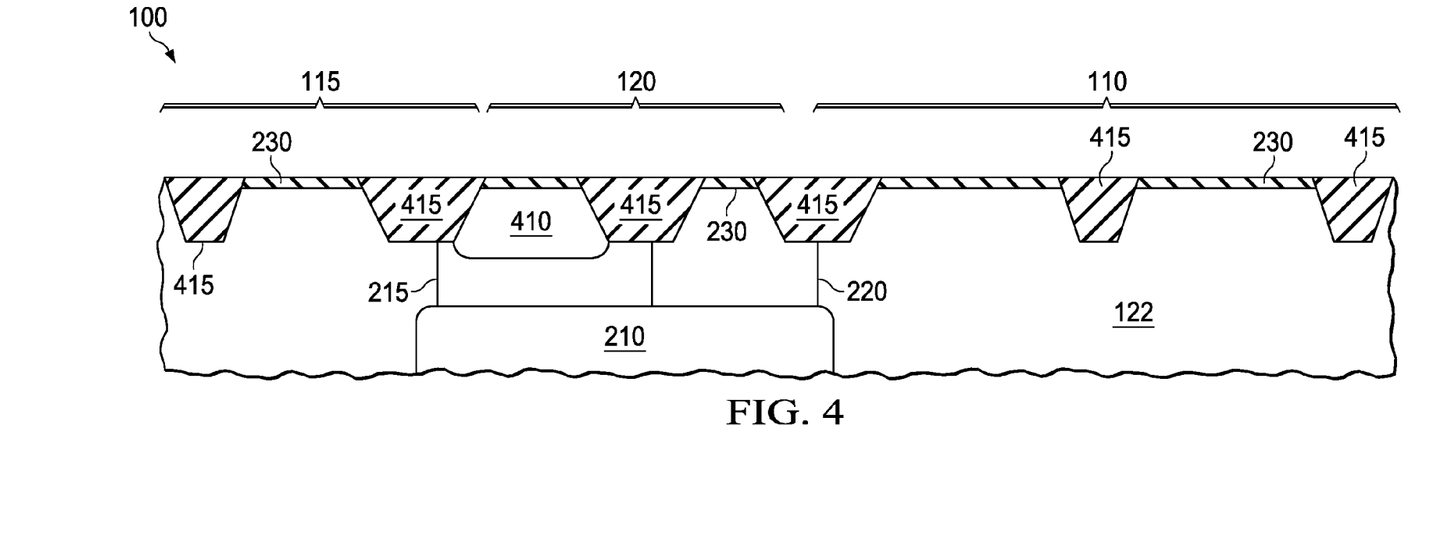

FIG. 4 illustrates the device 100 of FIG. 3 after the formation of a base 410 in BP region 120 and after an oxide deposition process that fills the trenches 310 and forms isolation regions 415. In one embodiment, the oxide deposition process is a high density plasma (HDP) process. This offers benefits in those instances where the trenches have a high aspect ratio, and the device 100 includes a high voltage region, as illustrated in the embodiment of FIG. 4. The HDP process achieves a good fill, even in trenches having a high aspect ratio and provides improved isolation for high voltage device applications. As power requirements have increased and isolation trench aspect ratios have increased, semiconductor manufactures have turned to HDP processes because they offer a good alternative to meeting design requirements of high power devices when compared to other processes, such as atmospheric-pressure chemical vapor deposition processes (APCVD). However, it should be noted that APCVD processes are also within the scope of the embodiments described herein.

Though HDP oxide provides many advantages, as stated above, this oxide has a greater amount of stress associated with its application, and during deposition and sequential oxidation, gate oxide thinning results on the corners of active regions adjacent the isolation structure. This thinning affects the gate oxide integrity (GOI) by decreasing the oxide breakdown strength, and the increased stress associated with HDP oxide enhances the formation of silicon defects around the STI bottom corner. The embodiments set forth herein alleviate the problems associated with HDP fill process.

Figure 5:
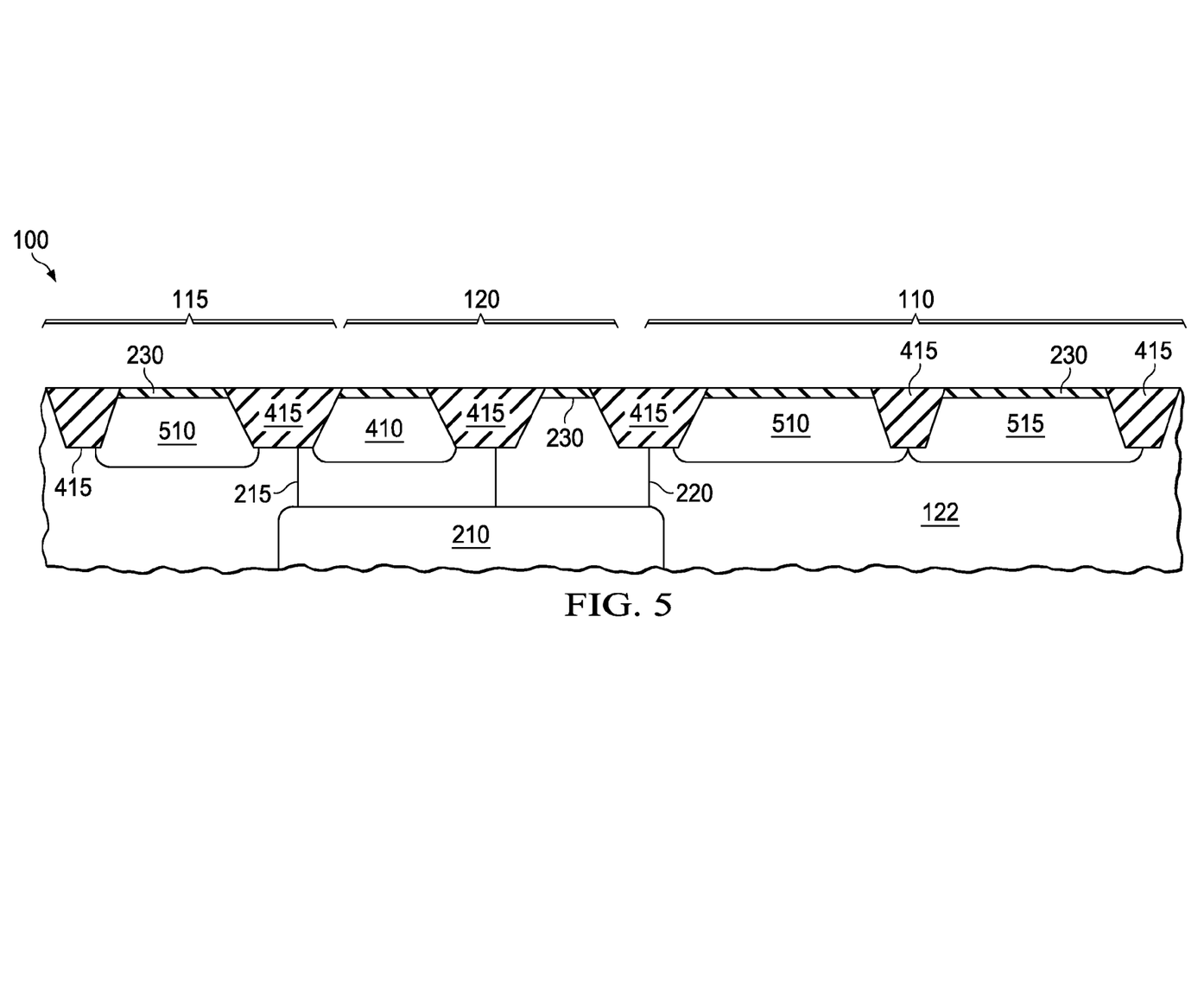

FIG. 5 illustrates an embodiment of the device 100 of FIG. 4 after the formation of PMOS active region 510 and NMOS active regions 515 in the HV and LV regions 110, 115, respectively. Conventional processes may be used to form these active regions and they will be appropriately doped with regard to their HV or LV function within the semiconductor device 100.

Figure 6A:
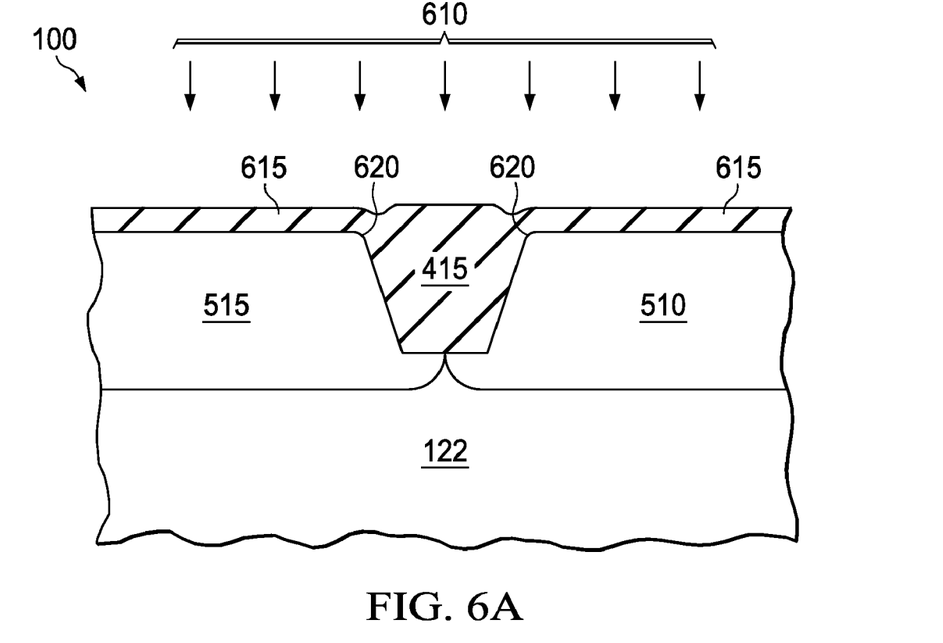

FIG. 6A is an enlarged view of the isolation region 415 located between the PMOS active region 510 and the NMOS active region 515 in the HV region 110. In this embodiment, the device 100 undergoes a dry oxidation process 610 within a furnace to form, which may include growing or depositing, a gate oxide layer 615 over the active regions 510, 515 and the corners 620, which, in certain embodiments may also include the edges of the active regions 510, 515.

In one embodiment, the oxidation process includes employing a gas flow including oxygen and a low molecular weight chloro-carbon wherein the chloro-carbon comprises about 6% or less of the gas flow. In such embodiments, the low molecular weight chloro-carbon contains three carbons or less. The lower molecular weight is beneficial in that has less of a tendency to condense or collect in the delivery system. In one embodiment, the low molecular weight chloro-carbon may be 1,2 dicholorethene (TLC). In one embodiment, the TLC may comprise from about 2% to about 6% of the gas flow. As seen below, when compared to conventional processes, the use of these cholor-carbons within the specified range provides the benefit of providing additional thickness of the gate oxide layer 615 over the corners 620, while maintaining good thickness control of the gate oxide layer 615 over the remaining portion of the active regions 510, 515 within design parameters.

In an alternative embodiment, a chloro-propene may be used. The inclusion of the low weight chloro-carbon provided unexpected benefits in combating the above-discussed GOI problems associated with using a HDP process. Further, as mentioned above, the use of chloro-carbon is contrary to current manufacturing process because of the concerns of the corrosive effects of the condensates of these compounds that can form in the delivery tubes. Not only does the corrosion shorten the useful life of the delivery system, the corrosive effects of these compounds release metals from the delivery tubes that can ultimately contaminate the semiconductor device. However, the use of the above cholor-carbons is not susceptible to the above-mentioned corrosion problems as the chlorine is only freed from the carbon inside the furnace at temperature and in the presence of oxygen.

In one aspect, the flow of the oxygen may range from about 8 liters to about 12 liters and a flow of the low molecular weight chloro-carbon may range from about 0.16 liters to about 0.72 liters. These ranges provide improved results over conventional processes. Further, in certain embodiments, the temperature of the dry oxidation process may range from about 850° C. to about 1000° C. and the gas may be flowed for a period ranging from about 5 minutes to about 30 minutes. Due to the increased efficiencies associated with the low molecular weight chloro-carbon, the overall oxidation time can be reduced. The above stated temperature range is beneficial in that lower times may increase production time and higher temperatures may make it more difficult to achieve the desired thicknesses.

The HV region 110, the LV region 115, and the BP region 120 may be exposed to the dry oxidation process, after which the oxide layer 615 can be conventionally removed from the LV region 115 and BP region 120. Alternatively, the LV region 115 and the BP region 120 may be protected from the oxidation process by a photolithographic mask.

In another aspect, the dry oxidation process 610 may be preceded by a nitrogen/oxygen purge followed by a ramp phase. In such embodiments, during the purge, the nitrogen and oxygen gas mixture is flowed in the furnace at a temperature ranging from about 700° C. to about 900° C., and the ramp phase is conducted by flowing nitrogen and oxygen at a temperature of about 900° C. for a period of about 25 minutes or less. Because of the advantages associated with the processes described herein, the time for the ramp phase can be decreased over conventional processes, thereby decreasing fabrication time and improving efficiency.

Figure 6B:
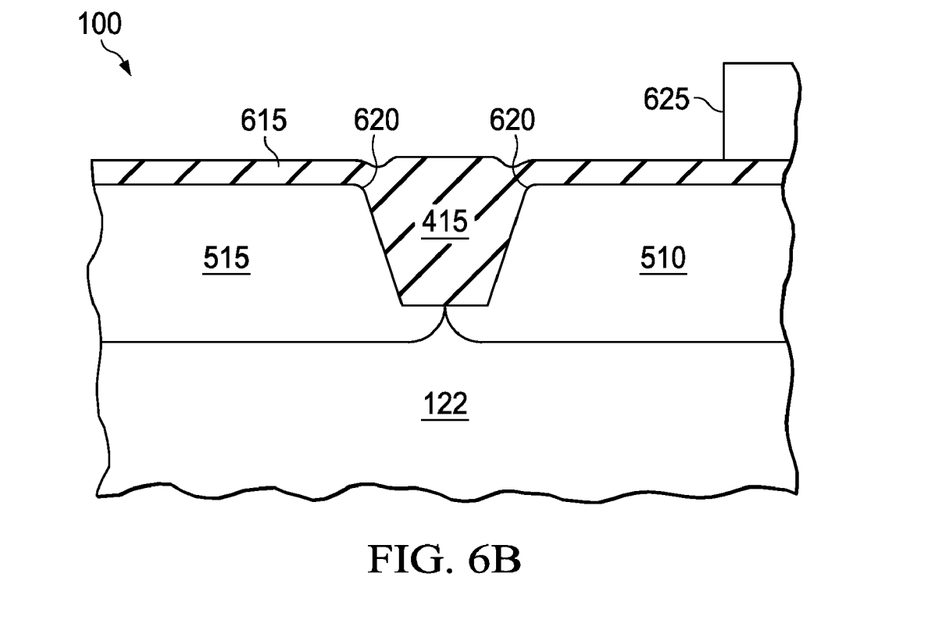

The dry oxidation process 610 provides greater control over the formation of the oxide layer 615, such that required gate oxide thicknesses can be achieved while also increasing the thickness over the corner 620 of the active regions 510, 515. For example, in one embodiment the ratio of the thickness of the gate oxide on the corner 620 to the thickness of the gate oxide located over the active region 510, 515 may range from about 0.6:1 to about 0.8:1. The improved ratio and thicker oxide over the corners 620 provide a gate oxide thickness that is necessary for high voltage applications and is beneficial for gate oxide integrity and device reliability. Additionally, the yield strength or elasticity of the substrate can be enhanced by using TLC in HV gate oxidation process. In one embodiment, the thickness of the HV oxide layer 615 over the HV active region may range from about 10 nm to about 20 nm and the thickness of the HV oxide layer over the corners may range from about 6 nm to about 16 nm. For example, the thickness of the HV oxide layer over the HV active region may be about 15 nm and the thickness of the HV oxide layer over the corners may be about 9 nm. These thicknesses are desirable because they meet high voltage design requirements for optimum operation. Briefly, FIG. 6B, which is not to scale, shows the device 100 of FIG. 6A after the formation of a gate 625 in which only a portion of the gate structure is illustrated. Conventional processes may be used to form and pattern the gate. Following the formation of the gate 625, conventional processes may be used to arrive at the device as shown in FIG. 1.

Figure 7:
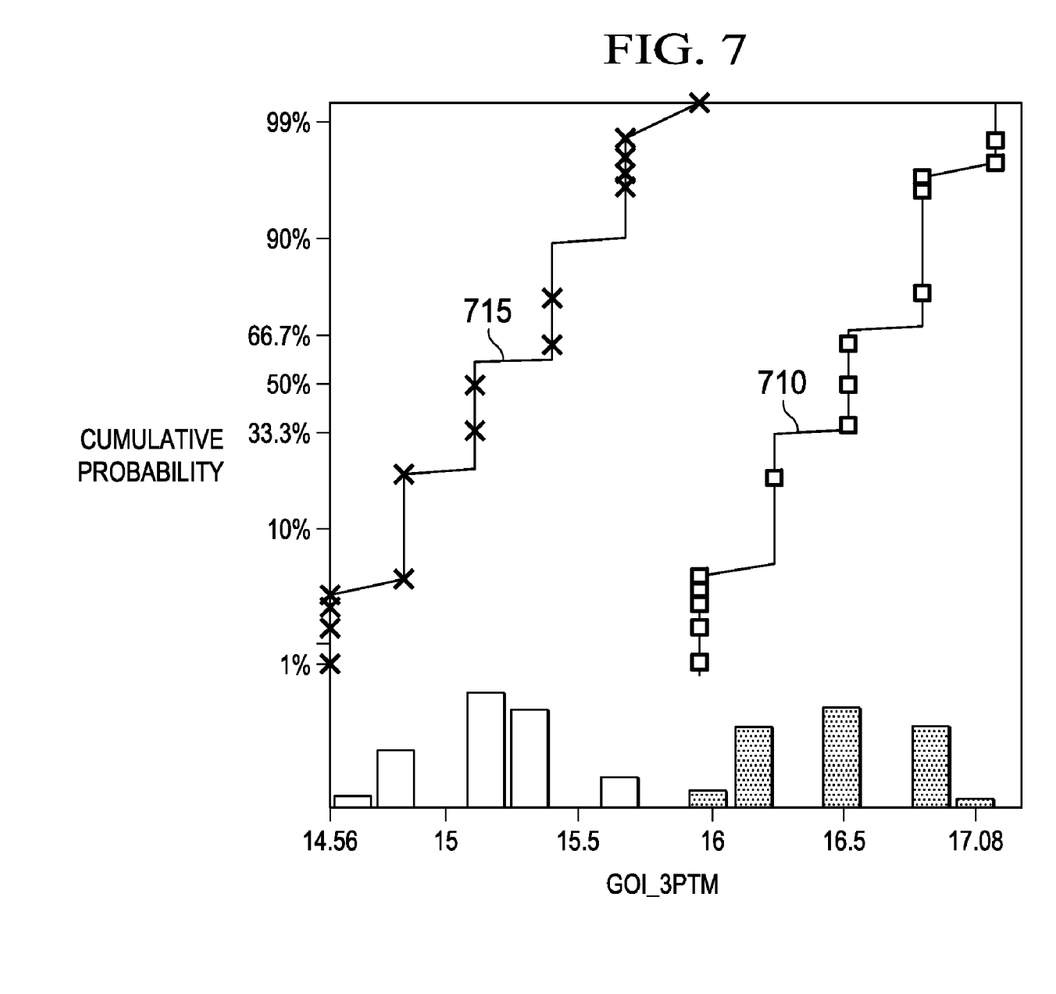
FIG. 7 illustrates the improvements in voltage breakdown of a device fabricated using the principles of this disclosure.

FIG. 7 illustrates the improved results afforded by the embodiments discussed above. Curve 710 represents GOI voltages of a device made in accordance with an embodiment discussed herein, wherein 4% TLC was used during the dry oxidation process, and curve 715 represents GOI voltages of a device made using conventional process. As seen in FIG. 7, curve 710 shows an improvement in the GOI in the PMOS device in a HV region where the average GOI is about 16.5 volts which is an improvement of about 1.5 volts over conventional devices. This improved GOI graphically illustrates that a device made in accordance with this disclosure will have a longer operating life than devices made using conventional processes because of the increased gate oxide thickness and integrity.

Figure 8:
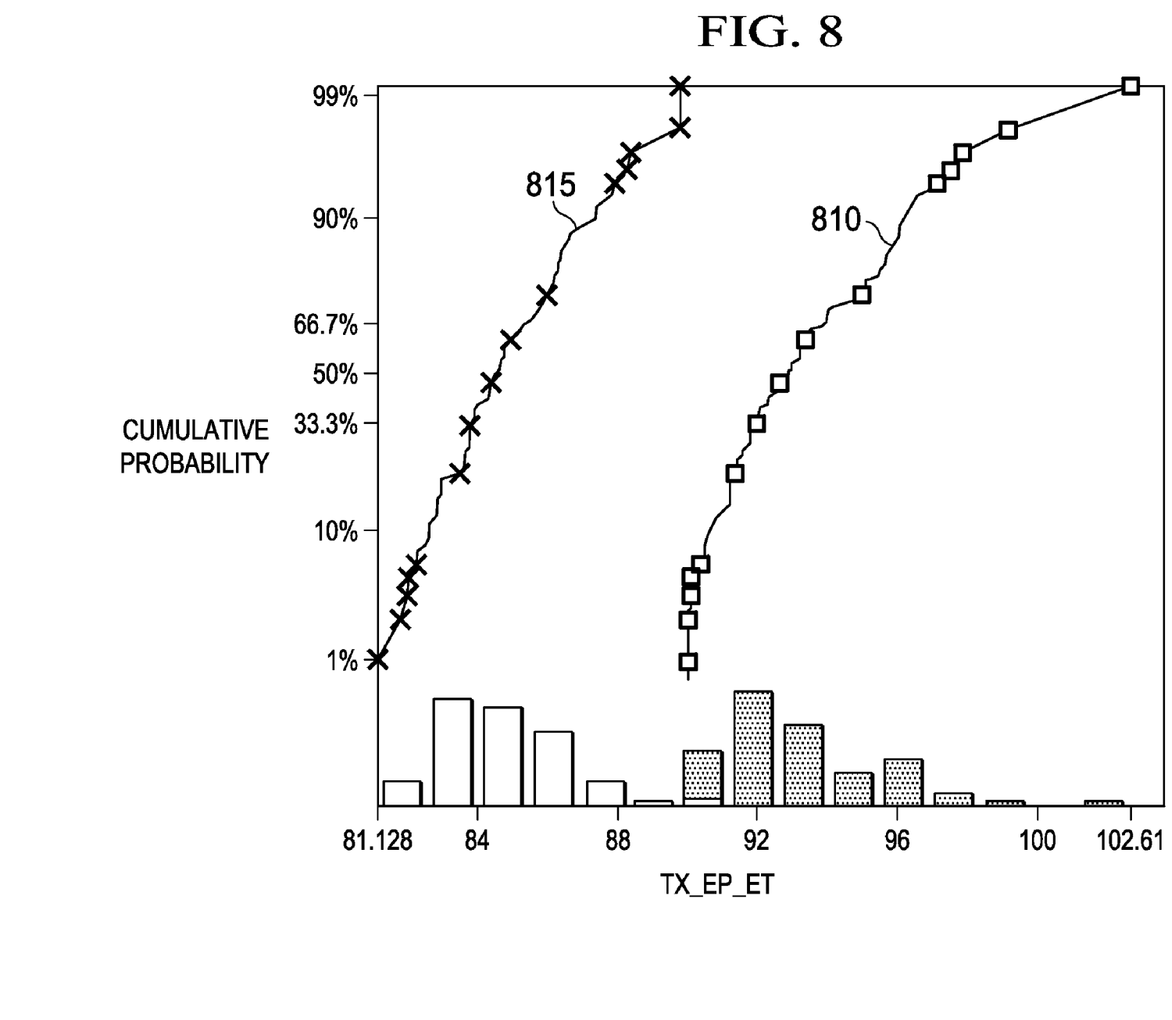
FIG. 8 illustrates the improvement in the oxide thickness at the corners of the active regions of a device fabricated using the principles of this disclosure.

FIG. 8 also illustrates the improved results afforded by the embodiments discussed above regarding the thickness of the oxide on the corners of the active region. Curve 810 represents the oxide thickness over the corners of the active regions based on electrical measurements of a device made in accordance with an embodiment discussed herein, wherein 4% TLC was used during the dry oxidation process, and curve 815 represents oxide thickness over the corners of a device made using conventional process. As seen in FIG. 8, curve 810 shows an improvement in the average oxide thickness over the average oxide thickness of curve 815. The average improvement (50%) is about 1 nm. This increased thickness provides a device with improved reliability.

In addition to the above stated advantages and as mentioned above, STI stress related defect density is also reduced compared to conventional processes when using the processes covered by this disclosure. For example, devices fabricated using a 4% TLC at 900° C. during the dry oxidation process incurred 40% lower yield loss of 5.22% due to STI stress related defect densities. In contrast, devices fabricated using conventional processes incurred an 8.92% yield loss.

Those skilled in the art to which the disclosure relates will appreciate that other and further additions, deletions, substitutions, and modifications may be made to the described example embodiments, without departing from the disclosure.

What is claimed is:

1. A semiconductor device, comprising:
   high voltage (HV) active regions located in a semiconductor substrate, wherein each of the HV active regions is located between isolation regions and has a corner adjacent the isolation regions and the isolation regions comprise a high density plasma oxide;
   a HV gate oxide layer located over the HV active regions having a thickness of greater than 5 nm and wherein a ratio of a thickness of the HV gate oxide layer over the corner to a thickness of the HV gate oxide layer over the active region ranges from about 0.6:1 to about 0.8:1;
   HV gates located over at least a portion of the HV gate oxide layer;
   low voltage (LV) active regions located in the semiconductor substrate;
   a LV gate oxide layer located over the LV active regions and having a thickness less than about 5 nm; and
   a LV gate located over at least a portion of the LV gate oxide layer.

2. The device of claim 1, wherein a thickness of the HV gate oxide layer over the HV active region ranges from about 10 nm to about 20 nm and the thickness of the HV gate oxide layer over the corners ranges from about 6 nm to about 16 nm.

3. The device of claim 2, wherein the thickness of the HV gate oxide layer over the HV active region is about 15 nm and the thickness of the HV gate oxide layer over the corners is about 9 nm.

4. The device of claim 1, wherein a length of the HV gate is less than about 0.5 um.

5. The device of claim 1, wherein an average HV gate oxide breakdown voltage is greater than 14 volts.

6. A semiconductor device, comprising:
   an active region located in a semiconductor substrate and between isolation regions and having a corner at each of the isolation regions;
   an oxide layer located over the active region and the corner, wherein a ratio of a thickness of the oxide layer over the corners to a thickness of the oxide layer over the active region is about 0.6:1 to about 0.8:1; and
   a gate located over at least a portion of the oxide layer.

7. The device of claim 6, wherein a thickness of the oxide layer over the active region ranges from about 10 nm to about 20 nm, and the thickness of the oxide layer over the corners ranges from about 6 nm to about 16 nm.

8. The device of claim 7, wherein the thickness of the oxide layer over the active region is at least about 15 nm and the thickness of the oxide layer over the corners is at least about 9 nm.

9. The device of claim 6, wherein a length of the gate is less than about 0.5 um.

10. The device of claim 6, wherein a gate oxide breakdown voltage is about 14 volts or greater.

* * * * *